United States Patent [19]

Norkus et al.

[11] Patent Number: 5,300,778
[45] Date of Patent: Apr. 5, 1994

[54] MULTISPECTRAL SENSOR

[75] Inventors: Volkmar Norkus; Christian Schiewe; Frank Nagel, all of Dresden, Fed. Rep. of Germany

[73] Assignee: ULTRAKUST electronic GmbH, Ruhmannsfelden, Fed. Rep. of Germany

[21] Appl. No.: 958,188

[22] Filed: Oct. 9, 1992

[30] Foreign Application Priority Data

Oct. 9, 1991 [DE] Fed. Rep. of Germany ....... 4133481

[51] Int. Cl.$^5$ .............................................. G01N 21/25
[52] U.S. Cl. ................................ 250/339.01; 250/226; 250/349; 250/353
[58] Field of Search ................ 250/339, 370.06, 338.3, 250/226, 349, 353

[56] References Cited

U.S. PATENT DOCUMENTS 5,041,723 8/1991 Ishida et al. ......................... 250/339

Primary Examiner—Carolyn E. Fields
Attorney, Agent, or Firm—Keck, Mahin & Cate

[57] ABSTRACT

The invention relates to a multispectral sensor with several filters and sensor elements for different spectral ranges of a radiation to be measured. The object of the invention is to so further develop a multispectral sensor of this type that it can be manufactured as a discrete component with small dimensions and has a high measuring accuracy, whilst obtaining a high output signal. This object is achieved in that the beam is broken down by an optical device into several partial beams and reflected onto filters. Behind the filters are located radiation-sensitive elements, which detect the spectral range corresponding to the transmission range of the in each case upstream filter. The remaining spectral range of the partial beam is reflected by the filter surface towards the other filters. Thus, each filter is supplied with the associated spectral ranges of all the partial beams.

19 Claims, 6 Drawing Sheets

MULTISPECTRAL SENSOR

BACKGROUND OF THE INVENTION

1. Field of the Invention

The invention relates to a multispectral sensor, in which different spectral ranges of a radiation to be measured are determined.

2. Background of the Disclosure

Such sensors make it possible to carry out accurate temperature measurements, because through measuring in different spectral ranges it is possible to largely compensate the influencing of the measurement result by widely differing emissivities in different spectral ranges.

In order to obtain a precise picture of the spectral range of the radiation to be measured, it is necessary for an identical test beam to be supplied to the channels for different spectral ranges.

Various multispectral processes are known, which in particular differ through the methods of spatial and spectral dispersion of the radiation. The use of dispersing optical components, e.g. prisms, particular for the analysis of broad-band spectral ranges, requires a very high adjustment and space requirement. Such processes can consequently not be used for a sensor, which is to be designed as an easily manipulatable, discreet component with small dimensions.

The use of a multispectral sensor as proposed in East German Patent 28 11 04 is fundamentally possible, but as a result of the usable number of pyroelectric materials with the corresponding optical characteristics, is limited to a small number of spectral channels (<4) and corresponding uses.

The use of discrete filters for the spectral dispersion of the total radiation has hitherto only been useful in conjunction with swinging-in mechanisms, e.g. a filter wheel, in the case of a serial readout of a single-component sensor, or as a planar arrangement of individual filters in juxtaposed or continuous manner on a substrate.

The disadvantage of the first variant is inter alia the varying measurement spot in the case of moving objects and the time superimposition of the output signals in the case of serial readout with simultaneously reduced sensitivity. The second variant leads to different measurement spots and is consequently unusable for precise measurements.

Thus, the hitherto known multispectral measuring devices have both a large material and space requirement and also a considerable adjustment effort is required. This in turn leads to mechanical instability and to limited local resolution of the measurement.

SUMMARY OF THE INVENTION

The object of the invention is a multispectral sensor of the aforementioned type, which can be manufactured with small dimensions, which in the case of high sensitivity ensures an almost identical measurement spot in the individual spectral channels and which is characterized by high operational reliability.

According to the invention this object is achieved by a multispectral sensor according to claim 1. Advantageous further developments of the invention form the subject matter of subclaims.

According to the invention the total radiation incident in the sensor casing is subdivided into several partial beams by the optical device. These partial beams are deflected by the optical device onto filters, which surround the optical device preferably in centrosymmetrical or rotationally symmetrical manner. The filters are transparent for a specific spectral range of the incident beam and are constructed in reflecting manner for at least part of the remaining spectral range. The filter transmission ranges differ from one another. Thus, each filter only permits the passage of the spectral range of its own transmission range towards the radiation-sensitive element behind it and reflects the remaining spectral range of the partial beam in the direction of the other filters, which surround the optical device. As a result, each filter is supplied with a spectral range of all the partial beams corresponding to its transmission range and substantially each filter is supplied with an identical measurement beam and consequently each radiation-sensitive element approximately sees the same measurement spot.

Preferably the filters are arranged in parallel to the optical axis of the incident beam around the optical device in the manner of a cage. If the cage wall having the aperture is aluminized on its inside, it is ensured that partial beams are reflected in the cage until they encounter a filter with the associated spectral transmission range. For this purpose it is necessary for the walls and the filters, outside the transmission range thereof, to have a high reflectivity, so that a partial beam is not successively absorbed after several reflections within the cage without striking all the filters with the associated spectral transmission ranges.

The optical device can be constructed in the manner of a pyramid with a n-angular base and around said pyramid are arranged n filters, with which is in each case associated its own radiation-sensitive element with its own measurement channel. The apex of the pyramid can project into or out of the cage.

Apart from a pyramid, it is also possible to use other geometrical shapes, such as e.g. cones, hemispheres, concave, i.e. inverted pyramidal elements and similar structures. The surfaces of the optical device are coated with one or more highly reflecting coating. They are preferably made highly reflecting in a spectral, broadband manner using a gold coating.

If the optical device is arranged in rotary manner about the optical axis of the incident beam, it is also possible to use as radiation-sensitive elements pyroelectric elements, which only operate in the case of chopped light. Then in alternating manner reflecting and absorbing surfaces are located on the pyramids, so that each filter during a pyramid rotation is successively passed over by a reflected partial beam and then receive no light for a certain period of time. Thus, it is possible to obviate the placing of a mechanical light chopper upstream of the aperture of the multispectral sensor. The rotating optical device, particularly a pyramid, consequently permits the chopping of the incident beam.

The multispectral sensor according to the invention can be manufactured with very small dimensions, so that it can be used for gas analysis, particularly waste gas analysis, in protection and security applications and for material detection. However, a preferred field of use is in connection with temperature sensors, particularly in the infrared field.

According to a preferred embodiment, a multispectral sensor is characterized in that in the optical path behind the aperture is located a broad-band, highly reflecting means for the spatial dispersion of the total beam into partial beams symmetrically to the optical axis of the system and said optical means or said optical device is located in a filter cage, whose filters are oriented approximately parallel to the optical axis of the system and behind which there are radiation-sensitive elements in the optical path of the reflected partial beams. On the radiation incidence side the filters have a high reflectivity outside the transmission range thereof and are so positioned that at least the facing filter has a high transmission for at least part of the reflected spectrum. The filters are preferably constructed as infrared band-pass filters and are so joined together that there are no radiation losses by absorption on the cage.

BRIEF DESCRIPTION OF THE DRAWINGS

The invention is described in greater detail hereinafter relative to the attached drawings, wherein show:

FIG. 1 shows a multispectral sensor 10, which is located in a commercially available TO 8 casing 11. The casing 11 comprises a casing top 12, on whose end face 14 is provided an entrance port 16 for the entry into the interior of the casing 11 of radiation to be measured 18. At the side opposite to the end face 14, the casing 11 is sealed by a casing bottom 20.

Figure 1:
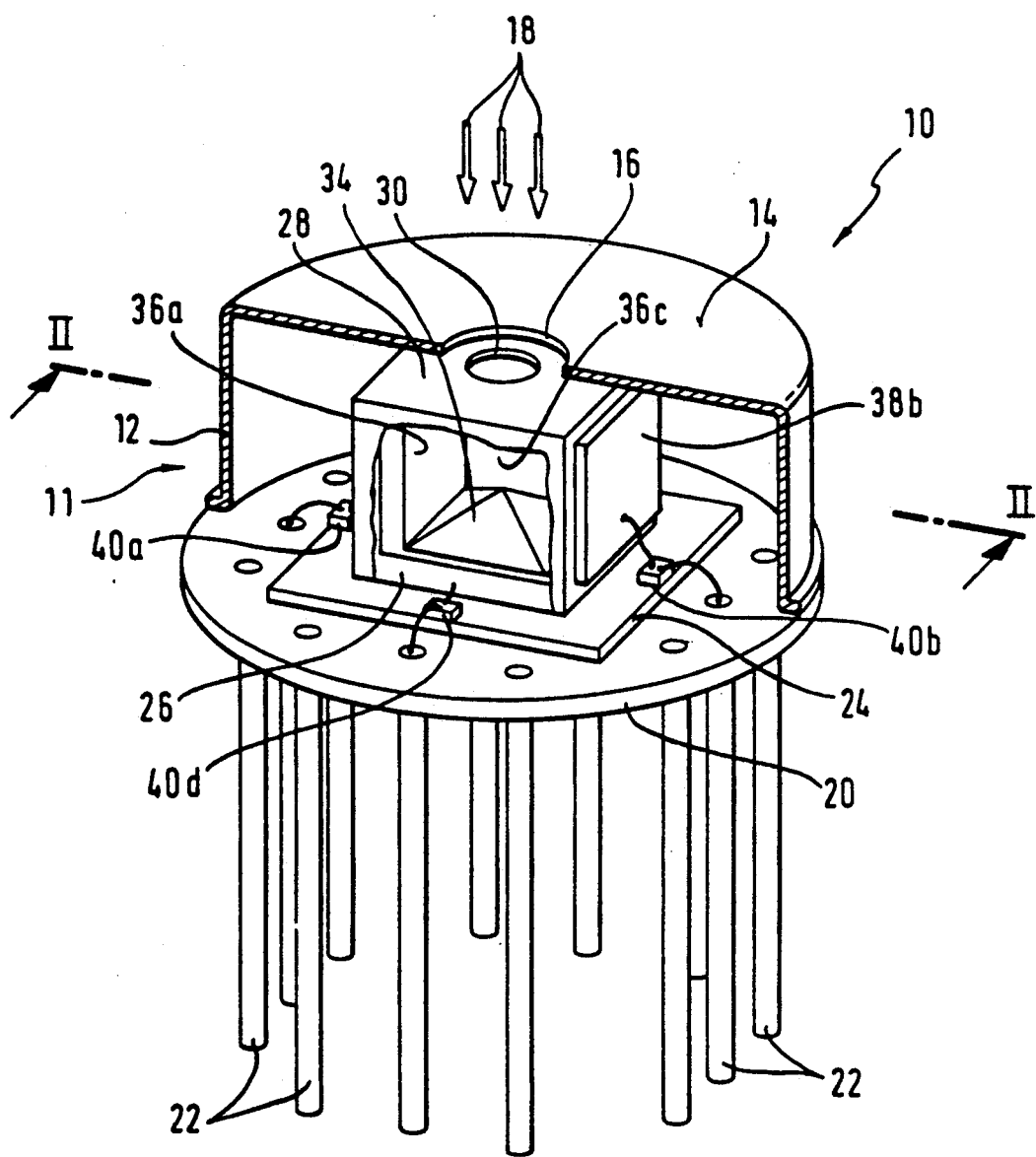
FIG. 1 A perspective, part sectional view of a preferred embodiment of the multispectral sensor.

Connecting pins 22 project perpendicularly downwards from the casing bottom 20, which carries a wiring carrier 24, on which is in turn fitted a roughly cubic cage 26. The top of the cage 26 facing the entrance port 16 of the casing top 12 is constructed as an aperture stop 28, which has a central aperture 30.

Figure 2:
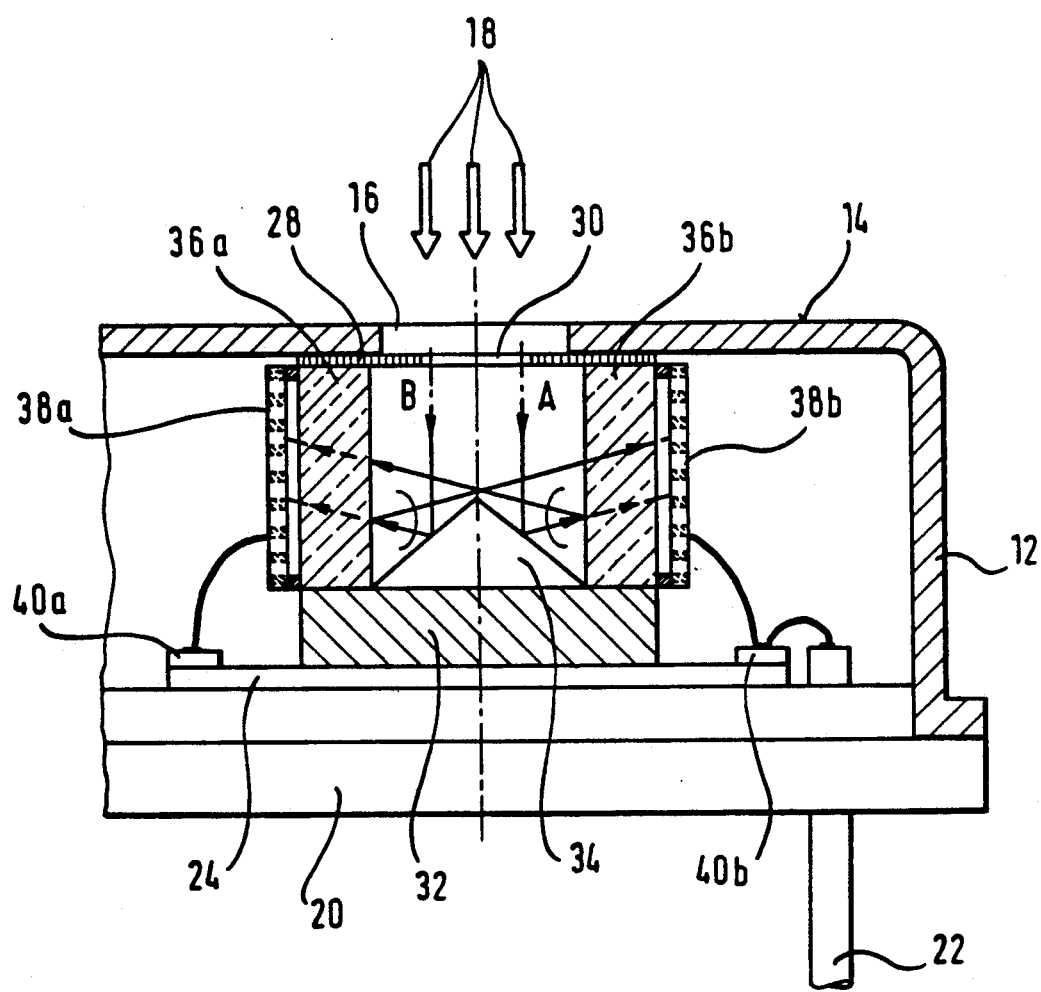
FIG. 2 A partial view along the section II—II of FIG. 1.

A pyramid 34 with a square base is placed on the cage bottom (cf. also FIG. 2). The circumferential surfaces of the pyramid 34 facing the aperture 30 have a high reflectivity for the total radiation 18 entering through the aperture 30. After passing through the aperture 30, the total radiation 18 is reflected in accordance with the arrows A, B on the surface of the pyramid 34 in the direction of the cage side walls, which are formed by infrared band-pass filters 36. In each case these filters 36a/b have differing transmission ranges outside which they are highly reflecting. Thus, the spectral part of the beam A in the transmission range of the filter 36b passes through the latter to a radiation-sensitive element 38b, which is located in the optical path behind the filter 36b, i.e. on the outside of the cage 26. The part of the partial beam A not in the transmission range is reflected by the filter 36b in the direction of the facing filter 36a with respect to the pyramid 34 and vice versa. In this way the partial beams are reflected onto all four filters 36a to 36d surrounding the pyramid 34, so that each filter 36a to 36d is supplied with the spectral range of all the partial beams A, B corresponding to the particular transmission range present.

The inside of the aperture stop 28 facing the interior of the cage 26 is also made highly reflecting for the total spectral range of the incident radiation, so that radiation reflected by the filters is again reflected back onto the surface of the other filters.

The radiation-sensitive elements 38 are electrically connected to signal processing stages 40, whose outputs are in turn connected to the connecting pins 22.

The casing of the infrared multispectral sensor 10 is constructed as a commercially available TO 8 casing and can be consequently used for probes having small dimensions, e.g. for exhaust gas testing.

Figure 3:
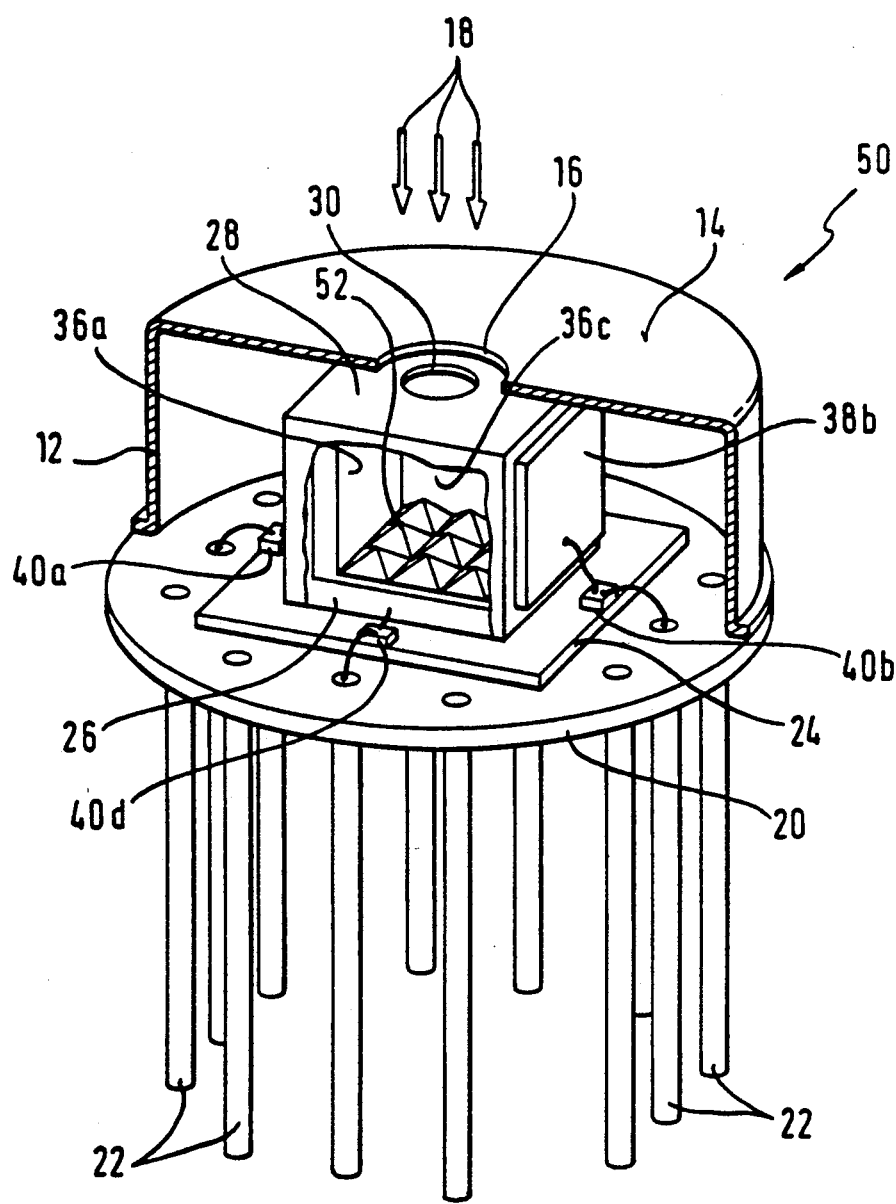
FIG. 3 A view according to FIG. 1 of another preferred embodiment.

FIG. 3 shows another embodiment 50 of a multispectral sensor which is substantially identical to that of FIG. 1 and which differs from the sensor 10 according to FIG. 1 only in that in place of a pyramid 34 with a square base, a structured surface 52 comprising nine small pyramids with a square base is used as the optical device. It is also possible to use other geometrical shapes, e.g. pyramids stretched towards the outside of the cage or spherical geometrical shapes for the dividing up of the beams. All that is important is that there is a uniform division of the total radiation 18 into uniformly large partial beams.

If the radiation-sensitive elements 38 are constructed as pyroelectric elements, it is possible to arrange the pyramids 34 in rotary manner and to provide in each case two facing surfaces on the top of the pyramids with an absorbing coating. As a result the pyroelectric elements are supplied with chopped light, without it being necessary to provide upstream or downstream of the entrance port 16 of the casings 11 a chopper element for the mechanical chopping of the light, e.g. in the manner of an impeller. In another preferred embodiment the radiation-sensitive elements 38 can be vacuum thermocouples, thermopiles or photodiodes.

Figure 4:
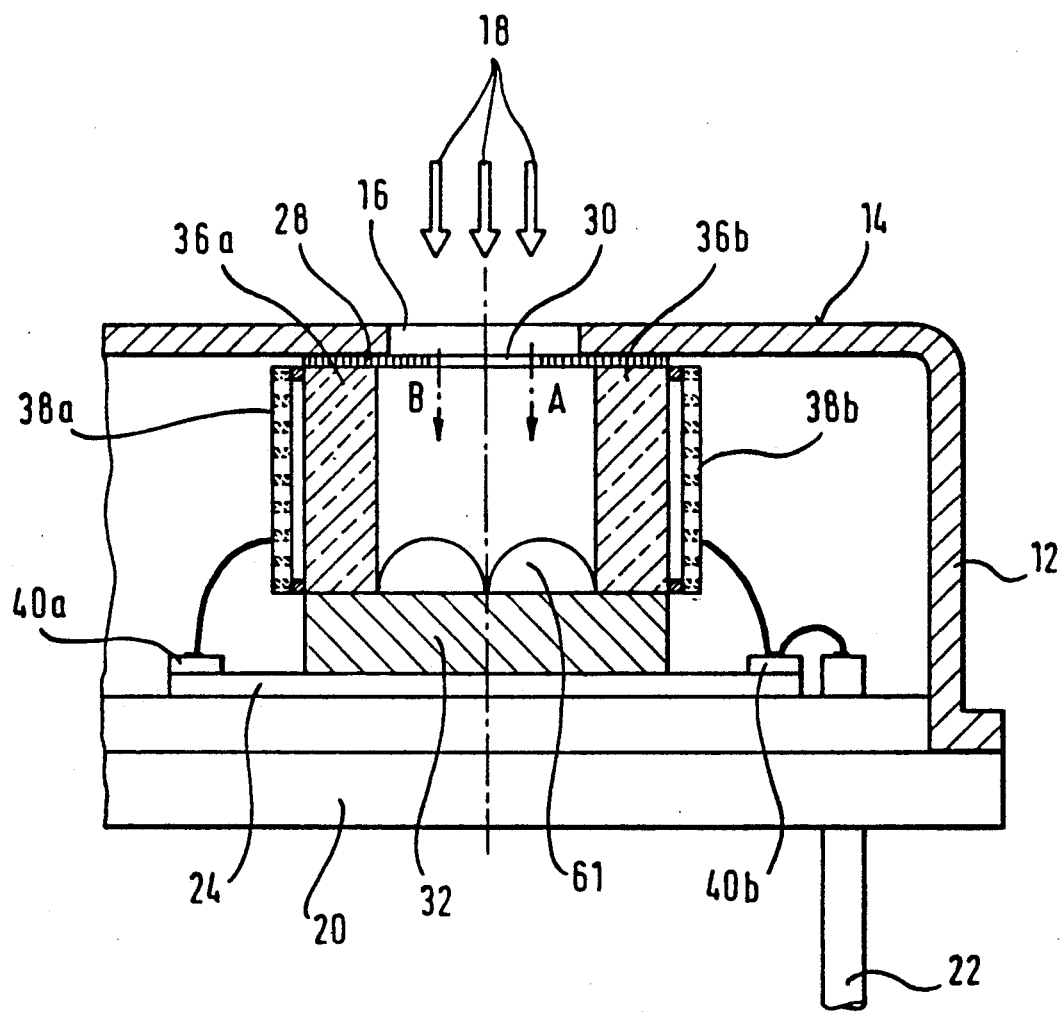
FIG. 4 is a partial view, similar to FIG. 2, showing several hemispheres.

In FIG. 4 the partial view that can be compared with FIG. 2 shows two hemispheres 61 which are used instead of a pyramid.

Figure 5:
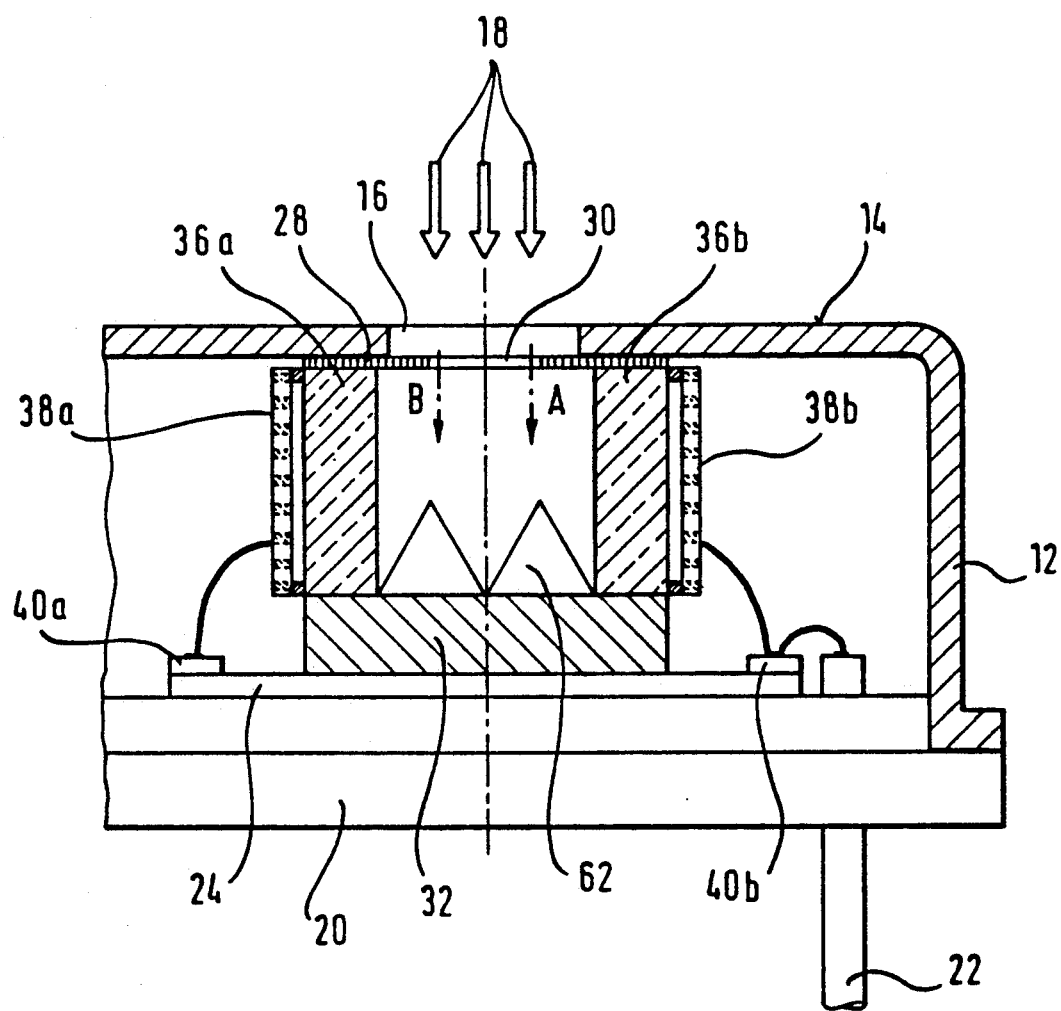
FIG. 5 is a partial view, similar to FIG. 2, showing several cones.

The comparable FIG. 5 shows two cones 62 which are coated with a highly reflecting coating.

Figure 6:
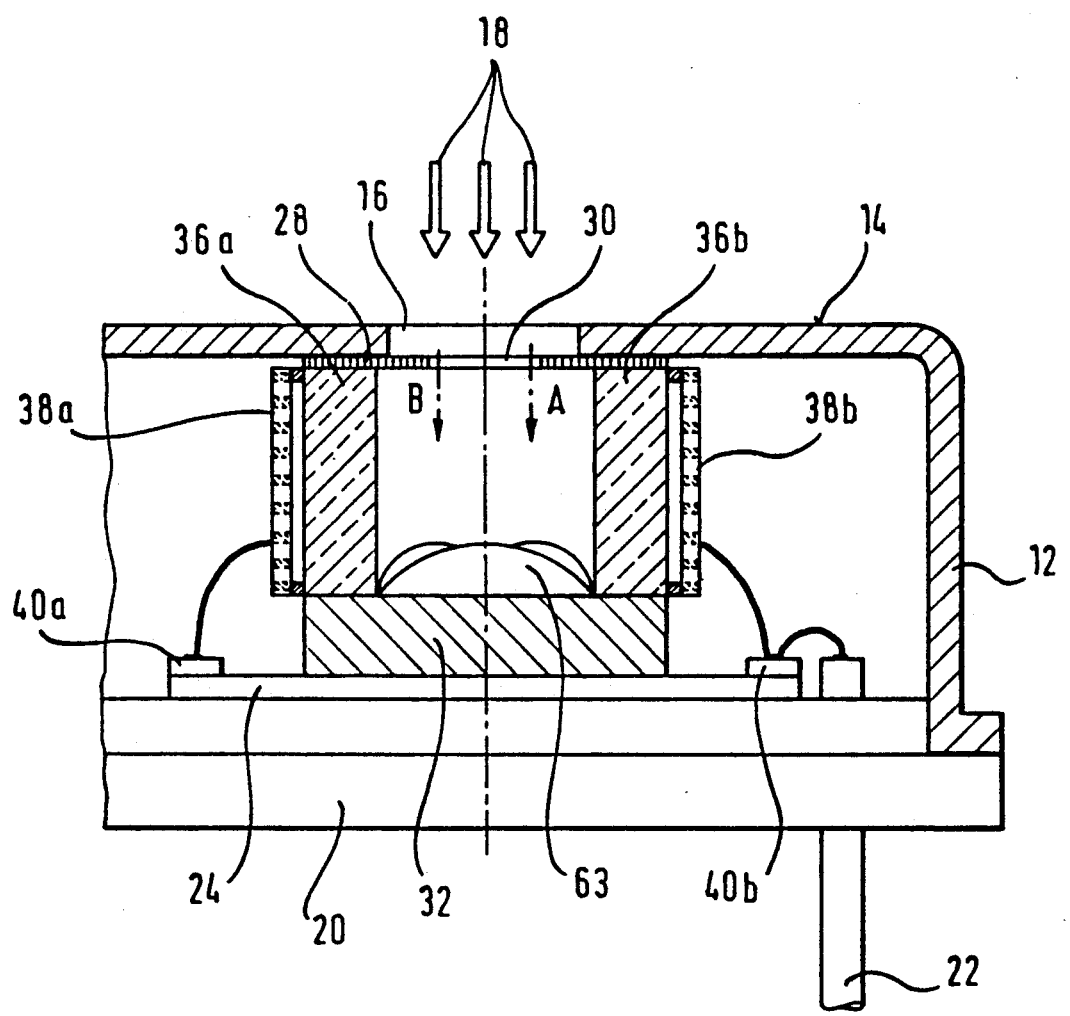
FIG. 6 is a partial view, similar to FIG. 2, showing several spherical segments.

In FIG. 6 several spherical segments 63 are used as reflecting elements.

What is claimed is:

1. A multispectral sensor with a casing (11), an entrance port (16) for radiation (18) to be measured and located in the casing (11) and an optical device (34) located in the optical path behind the entrance port (16) for dividing up the beam (18) incident through the entrance port (16) into partial beams A, B, a plurality of filters (36a to 36d), which surround the optical device (34) and have different spectral transmission ranges and outside which they have a reflecting construction, and radiation-sensitive elements (38a to 38d) arranged in the optical path of the partial beams A, B behind the filters.

2. A multispectral sensor according to claim 1, wherein the filters (36a to 36d) are oriented approximately parallel to the optical axis of the incident beam (18).

3. A multispectral sensor according to claim 1, wherein the optical device (34, 52) has reflecting surfaces inclined relative to one another and which are constructed in highly reflecting manner for the spectral range of the beam (18) to be measured.

4. A multispectral sensor according to claim 3, wherein the reflecting surfaces are arranged in rotationally symmetrical manner to the optical axis of the beam (18).

5. A multispectral sensor according to claim 3, wherein the optical device (34) is in the form of a pyramid with a polygonal base.

6. A multispectral sensor according to claim 5, wherein the number of angles of the base of the pyramid corresponds to the number of filters.

7. A multispectral sensor according to claim 3, wherein the reflecting surfaces are arranged centrosymmetrically to the optical axis of the beam (18).

8. A multispectral sensor according to claim 1, wherein the filters (36a to 36d) surround the optical device (34) in such a way that each filter has a high transmission for at least a part of the reflected spectral range of the facing filter (36b) with respect to the optical device (34).

9. A multispectral sensor according to claim 1, wherein the optical device (34) and the filters (36a to 36d) form the walls of a cage (26) arranged in the optical path behind the entrance port (16).

10. A multispectral sensor according to claim 9, wherein the cage wall (28) having a beam aperture (30) has a reflecting construction.

11. A multispectral sensor according to claim 1, wherein the optical device (52) has a plurality of pyramids coated with highly reflecting coatings.

12. A multispectral sensor according to claim 1, wherein the radiation-sensitive elements (38a to 38d) are constructed as pyroelectric elements.

13. A multispectral sensor according to claim 1, wherein the filters (36a to 36d) are constructed as interference filters.

14. A multispectral sensor according to claim 1, wherein the optical device (52) has a plurality of cones coated with highly reflecting coatings.

15. A multispectral sensor according to claim 1, wherein the optical device (52) has a plurality of hemispheres coated with highly reflecting coatings.

16. A multispectral sensor according to claim 1, wherein the optical device (52) has a plurality of spherical segments coated with highly reflecting coatings.

17. A multispectral sensor according to claim 1, wherein the radiation-sensitive elements (38a to 38d) are constructed as vacuum thermocouples.

18. A multispectral sensor according to claim 1, wherein the radiation sensitive elements (38a to 8d) are constructed as thermopiles.

19. A multispectral sensor according to claim 1, wherein the radiation-sensitive elements (38a to 38d) are constructed as photodiodes.

* * * * *